United States Patent
VandenBiesen et al.

(10) Patent No.: US 7,255,743 B2
(45) Date of Patent: Aug. 14, 2007

(54) METHOD OF MAKING SYNTHETIC GEMS COMPRISING ELEMENTS RECOVERED FROM REMAINS OF A SPECIES OF THE KINGDOM ANIMALIA

(75) Inventors: Russell P. VandenBiesen, Naperville, IL (US); Gregory R. Herro, Chicago, IL (US); Dean T. VandenBiesen, Oshkosh, WI (US)

(73) Assignee: International Research & Recovery Corporation, Elk Grove Village, IL (US)

(*) Notice: Subject to any disclaimer, the term of this patent is extended or adjusted under 35 U.S.C. 154(b) by 359 days.

(21) Appl. No.: 10/643,330

(22) Filed: Aug. 19, 2003

(65) Prior Publication Data

US 2004/0031434 A1 Feb. 19, 2004

Related U.S. Application Data

(63) Continuation-in-part of application No. 10/100,666, filed on Mar. 18, 2002, now abandoned.

(60) Provisional application No. 60/306,053, filed on Jul. 17, 2001.

(51) Int. Cl.
*C30B 29/04* (2006.01)

(52) U.S. Cl. ............... 117/84; 117/86; 117/104; 117/929

(58) Field of Classification Search .......... 117/84, 117/86, 104, 929
See application file for complete search history.

(56) References Cited

U.S. PATENT DOCUMENTS

| | | | | |
|---|---|---|---|---|
| 3,454,363 | A | * | 7/1969 | Rieve .................. 423/461 |
| 3,835,064 | A | * | 9/1974 | Shinomiya et al. ......... 502/425 |
| 4,263,268 | A | * | 4/1981 | Knox et al. ............... 423/454 |
| 5,016,330 | A | | 5/1991 | Botsch |
| 5,762,896 | A | | 6/1998 | Hunter et al. |
| 6,025,289 | A | | 2/2000 | Carter et al. |
| 6,045,613 | A | | 4/2000 | Hunter |
| 2004/0154528 | A1 | * | 8/2004 | Page, Jr. ................. 117/84 |

OTHER PUBLICATIONS

Gillespie, "If you carat All . . . ," Arizona Republic Monday Aug. 29, 1988 pp. B1.

* cited by examiner

*Primary Examiner*—Robert Kunemund
(74) *Attorney, Agent, or Firm*—McAndrews, Held & Malloy, Ltd.

(57) ABSTRACT

This invention is a method of making a synthetic gem comprising elements recovered from remains of a species of the Kingdom Animalia, comprising the steps of collecting substantially pure carbon from the remains and creating gems from the carbon using crystal growth sublimation.

16 Claims, No Drawings

US 7,255,743 B2

METHOD OF MAKING SYNTHETIC GEMS COMPRISING ELEMENTS RECOVERED FROM REMAINS OF A SPECIES OF THE KINGDOM ANIMALIA

This is a continuation-in-part claiming priority of Non-Provisional application Ser. No. 10/100,666 filed on Mar. 18, 2002, now abandoned which claims priority of provisional patent application Ser. No. 60/306,053 filed Jul. 17, 2001. The provisional and non-provisional patent applications identified above are incorporated by reference in their entireties to provide continuity of disclosure.

BACKGROUND OF THE INVENTION

1. Field of the Invention

This invention relates to a method for making a synthetic gem out of remains recovered from a species of the Kingdom Animalia.

2. Description of the Related Art

Synthetic gems have been manufactured since the 1960s as an attempt to substitute for naturally occurring gems. Advances in the methods of manufacture have made it possible to produce synthetic gems of equal or better appearance than naturally occurring gems. Examples of these synthetic gems include the synthetic diamonds disclosed in U.S. Pat. No. 4,042,673, and the moissanite gems disclosed in, U.S. Pat. Nos. 5,762,896, 6,025,289, and 6,200,917.

Even though synthetic gems can be indistinguishable from naturally occurring gems to the untrained eye, a trained person in the jewelry field can easily distinguish between naturally occurring and synthetic gems by using the following methods, among others: viewing the refraction lines under a microscope, viewing metallic inclusions through the microscope, subjecting synthetic gems to shortwave ultraviolet light and viewing patterns caused by seed crystals under the microscope. Because of the relative ease with which a trained person can distinguish synthetic gems from naturally occurring gems, the synthetic gem's value is much lower than that of a naturally occurring gem. These factors have severely limited the appeal of the synthetic gems, and the success of the synthetic gem business as a whole. In the case of synthetic diamonds the cost to produce them is equal to, or more expensive than natural gem quality diamonds. Because of these factors, naturally occurring gems remain much more popular and valuable than synthetic gems.

Producers of synthetic gems are currently using graphite that is mined from beneath the earth's surface, or synthetic graphite made from burning wood in the absence of oxygen, as their source of carbon for producing synthetic gems. This carbon source cannot be traced to any specific animal, and commonly is derived from wood or other plant material, and therefore a gem produced solely from this source would have several disadvantages when compared to the present invention: a synthetic gem made solely from mined graphite would not be used as a memorial gem in a memorial or funeral service for a deceased human or animal; a synthetic gem made solely from mined graphite would not be used as a keepsake that preserves the remains and memories of the deceased for bereaved family, friends, loved ones, lovers, or acquaintances; a synthetic gem made solely from mined graphite would not provide a symbol of the bond between two individuals who wish to express their commitment by providing ingredients to a single synthetic gem; and a synthetic gem made solely from mined graphite would not produce a unique collectable gem celebrating a famous person.

Recently, synthetic gemstones have been attempted to be made from cremated remains. However, old cremation methods reduce human remains to ashes, typically consisting of bone ash and small amounts of elements including carbon. The ashes that remain from old cremation methods are typically light gray in color and are aesthetically pleasing to the relatives and loved ones of the deceased. Any black specks within the ashes usually represent elemental carbon, but these specks are not aesthetically pleasing because relatives and loved ones would rather have a uniform gray color. Typically, if there are any black specks present within the ashes, they are subjected to additional cremation to remove these conceived irregularities. This makes carbon collection difficult. In order to turn these remains into a synthetic diamond, the carbon must be separated from the bone ash, which can be done by the steps of collecting, filtering, purifying, and graphitized. This is a tedious process that optionally can be overcome by the present invention.

BRIEF SUMMARY OF THE INVENTION

A broad aspect of the invention includes a method for making a synthetic gem out of remains recovered from a species of the Kingdom Animalia by collecting substantially pure elemental carbon from the remains and creating gems from the carbon, as by using crystal growth sublimation to form diamonds. The synthetic gems may be faceted and polished utilizing conventional faceting and polishing techniques. The gems may also utilize a conventional marking system.

In use, the synthetic gem can function as a memorial item to be used in a funeral or memorial ceremony by survivors, family, friends, loved ones, and acquaintances. In addition, it can be used to remember a deceased loved one by mounting it in a number of different ways including, but not limited to: keepsakes, memorials, mementos, collectors items, loose gems, gems set in rings, watches, bracelets, pendants, earrings, anklets, waist bands, ornaments, crucifixes, rosaries, necklaces, statues, figurines, sculptures, art work, or custom gold, silver, platinum, brass, bronze, stainless steel, or copper settings.

This invention recognizes that if oxidation of the human remains during cremation is substantially reduced, the remains will be reduced to a significant portion of carbon and other trace elements. The elemental carbon that remains is typically uniformly black in color, which is not aesthetically pleasing to relatives and loved ones, but is preferable to the synthetic diamond making process because a significant portion of carbon is present to make numerous high quality synthetic diamonds. Thus, the amount of carbon collected after cremating the remains in a substantially reduced oxygen environment is significantly greater than the amount of carbon collected after typical cremation in the presence of oxygen. The preferred embodiment utilizes this principle of substantially reducing the oxidation process during cremation of the remains to produce carbon from the remains.

In this respect, before explaining the preferred embodiment of the present invention in detail, it is to be understood that the present invention is not limited in its application to the details of construction and to the arrangements of the components set forth in the following description or illustrated in the drawings. The present invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the present invention in any way.

These together with other objects of the present invention, along with the various features of novelty which characterize the present invention, are pointed out with particularity in the claims annexed to and forming a part of this disclosure. For a better understanding of the present invention, its operating advantages and the specific objects attained by its uses, reference should be had to the accompanying descriptive matter discussing a preferred embodiment of the present invention.

It is, therefore, an object of the present invention to collect substantially pure carbon from remains of a species of the Kingdom Animalia.

It is another object of the present invention to substantially reduce oxidation of remains of a species of the Kingdom Animalia during cremation.

It is another an object of the present invention to provide a method for making a synthetic gem out of elements recovered from remains of a species of the Kingdom Animalia.

It is another object of the present invention to provide a method for making a synthetic gem out of elements recovered from remains of one or more species of the Kingdom Animalia.

It is another object of the present invention to provide a synthetic gem to be used in a memorial or funeral service for a deceased human or animal.

It is a further object of the present invention to provide a synthetic gem to be used as a permanent keepsake that preserves the remains and memories of the deceased with a synthetic diamond, optionally a gem-quality diamond, for the bereaved family, friends, loved ones, lovers, or acquaintances.

It is still another object of the present invention to provide a synthetic gem which is a symbol of the bond between two individuals who wish to express their commitment by providing ingredients to a single synthetic gem.

It is yet another object of the present invention to provide a synthetic gem which provides a unique authenticated collectable gem celebrating a famous person.

Accordingly, the present invention eliminates the disadvantages of natural gems which cannot be traced to any specific human, animal, or even to one or more individuals of the Kingdom Animalia.

These and other objects of the present invention will become apparent in view of the present specification, claims and drawings.

There has thus been outlined, rather broadly, the more important features of the invention in order that the detailed description thereof that follows may be better understood, and in order that the present contribution to the art may be better appreciated. There are, of course, additional features of the invention that will be described hereinafter and that will form the subject matter of the invention. Those skilled in the art will appreciate that the conception, upon which this disclosure is based, may readily be utilized as a basis for the designing of other devices or methods for carrying out the several purposes of the present invention. It is important, therefore, that the invention be regarded as including such equivalent constructions and methods insofar as they do not depart from the spirit and scope of the present disclosure.

DRAWINGS

Not Applicable

DETAILED DESCRIPTION OF THE PREFERRED EMBODIMENT

While the invention may be susceptible to embodiments in different forms, there will be described in detail, the preferred embodiment with the understanding that the present disclosure is to be considered an exemplification of the principles of the invention, and is not intended to limit the claims to that which is described herein.

In the preferred embodiment, a synthetic diamond is made from carbon collected from the remains of a human. The invention can, however, be used to make a synthetic diamond from carbon collected from any desired source, including the remains of any animal in the Kingdom Animalia. The selected animal can include, for example, one or more vertebrates or invertebrates, and among vertebrates can include mammals, reptiles, birds, fish, or amphibians, for example. The collection of carbon from human remains is described below as one embodiment of the invention. The collection of carbon from animal remains, for example from the remains of a deceased pet, can be carried out in similar fashion, adjusting for the size and type of animal.

The preferred step to collect the carbon from the remains of a human begins with using a cool retort/refractory. Preferably, the cremation should be the first one of the day, after the retort has had a chance to cool down over night. Use of a cool retort slows the cremation process and gives the operator more time to collect the carbon before the carbon has completely combusted. Preferably, the remains should be in a suitable combustible container and placed into the retort feet first, with the head closest to the door of the retort. The remains should be positioned so that the head is not directly beneath the cremation burner, but rather closer to the door of the retort.

The preferred time to begin carbon collection is when the remains of the deceased begin to reduce to their essential elements, which will be approximately one hour after the cremation has started depending on the quantity of the remains. After combustion of the remains has progressed to the point of revealing carbonized remains such as organ tissue, the operator separates the carbonized remains from the rest of the remains. Organ tissue is the preferred tissue to collect carbon from since it will not reduce to bone ash, as will bones. The separation of carbonized tissue is preferably accomplished using a tool normally used for repositioning the remains during cremation.

This tissue is placed into a metal collection box, which can be, as one example, a square steel box made of ¼" (6 mm) thick steel. The box can be fabricated to be 6" (15 cm) wide×12" (30 cm) long×6" (15 cm) deep, and can have a steel cover. The box can be laid on its side so that tissue can be easily slid into the box. After the tissue is collected in the box, the operator tips it back upright, places the cover on top and leaves the collection box in the retort while the rest of the cremation is being performed. The collection box design substantially dries the tissue and allows exhaustion of pressurized gases, vapors and other by-products, as by slight displacement of the cover from the box, while substantially preventing other external gases such as oxygen from entering the container. This can be accomplished by providing a box that does not seal strictly airtight, but does limit the flow of gas. Thus, this container serves to substantially prevent or at least reduce oxidation of the tissue to carbon dioxide, carbon monoxide, or other gaseous carbon products and to at least substantially reduce the carbonized tissue to carbon without allowing the carbon to be consumed by combustion or mixed with a substantial quantity of bone that is reduced to calcium and/or ash.

Preferably, the carbonized tissue that remains from the retort is reduced to resemble black, brittle, and dry material, although some trace elements may still be present. The collection box preferably remains within the retort until the entire cremation is complete and the metal collection box is no longer glowing from the heat. These conditions signify an appropriate point to end the cremation process. When complete, preferably 2-4 ounces of dried carbon will be collected from an average quantity of human remains. Preferably, the carbonized remains of the deceased are not removed from the retort until the cremation has completely reduced the remains to their essential elements by incineration. After the carbon and metal collection box is cool and the carbon is dry, the particle size of the collected carbon is preferably reduced by suitably mechanically agitating the remains into a consistency appropriate for disposition and suitable for inurnment within a cremated remains container, an urn, or some other suitable container. This collected carbon is then suitable for the purification and graphitizing steps.

Alternatively, the tissues to be reduced to carbon can be processed in a different retort under conditions, such as a lower temperature and exclusion of oxygen, effective to optimize the collection of carbon.

In an alternative embodiment of the invention, the step to collect the carbon from the remains of a human begins with the removal of organ tissue from the remains. The removed organ tissue is then placed into a metal collection box such as that described above in connection with the preferred embodiment. After the tissue is placed in the box, the operator places the cover on top and positions the collection box in the retort and begins the cremation process. The collection box preferably remains within the retort until the entire cremation is complete and the metal collection box is no longer glowing from the heat. These conditions signify an appropriate point to end the cremation process. When complete, preferably 2-4 ounces of dried carbon will be collected from an average quantity of human remains. Preferably, the carbonized remains of the deceased are not removed from the retort until the cremation has completely reduced the remains to their essential elements by incineration. After the carbon and metal collection box is cool and the carbon is dry, the particle size of the collected carbon is preferably reduced by suitably mechanically agitating the remains into a consistency appropriate for disposition and suitable for inurnment within a cremated remains container, an urn, or some other suitable container. This collected carbon is then suitable for the purification and graphitizing steps.

In another alternative embodiment of the invention, the remains can be cremated conventionally, mixed with additional carbon from another source, and purified as described above. It is contemplated that, using this technique, a gem containing at least some of the original carbon from the cremated remains can be prepared, even if the amount of carbon present in the remains alone is insufficient to make a gemstone of desired size or type. It is further contemplated that the added carbon will serve to assist in separation or preservation of the original carbon from the conventionally cremated remains as the remains and added carbon are purified.

In the preferred embodiment, the remains are then purified and graphitized using the Halogen Purification technique. This is done by placing the remains in a High Temperature Vacuum Induction Furnace. The High Temperature Vacuum Induction Furnace utilizes vacuum pressure in the range of 30 torr to 500 torr and a temperature up to 3000 degrees Centigrade. Chlorine gas is injected into the furnace, and reacts with the impurities to form chlorides. The impurities leave the carbon in the form of chloride gases. After the impurities have been removed, the carbon that remains can be pure within 10 ppm. In addition to being pure within 10 ppm, the carbon also becomes graphitized by the high temperatures, which is necessary to provide graphite for the crystal growth process.

In the preferred embodiment, the process of crystal growth from sublimation is used according to techniques of the type described but not limited to the process described in U.S. Pat. Nos. 34,061, 6,200,917, 6,025,289, 6,045,613, 4,042,673 and 5,762,896. In the preferred embodiment, the purified/graphitized carbon from human remains is used to replace or supplement purified/graphitized carbon of other origin, and processed into synthetic diamonds.

In the preferred embodiment, the synthetic diamond may be a gem-quality diamond that can be faceted and polished utilizing conventional faceting and polishing techniques, which are well-known in the art. It is further contemplated that the diamond can be a white diamond or a tinted diamond, such as a yellow or blue diamond. Techniques for tinting or coloring diamonds are known in the synthetic diamond production art, and involve the introduction of dopants, generally in very small proportions, or utilization of non-carbon elements in the processed remains.

In the preferred embodiment, the diamond, as a client selected option, may utilize a laser marking system such as that disclosed in U.S. Pat. No. 6,211,484 in order to mark each diamond with its own individual identification corresponding to the individual who supplied at least a portion of the carbon for the diamond.

In use, the synthetic diamond can function as a memorial item to be used in a funeral or memorial ceremony by survivors, family, friends, loved ones, and acquaintances.

In addition, it can be used to remember a deceased loved human or animal by mounting it in a number of different ways including, but not limited to: keepsakes, memorials, mementos, collectors items, loose gems, gems set in rings, watches, bracelets, pendants, earrings, anklets, waist bands, ornaments, crucifixes, rosaries, necklaces, statues, figurines, sculptures, art work, or custom gold, silver, platinum, brass, bronze, stainless steel, or copper settings.

In the preferred embodiment, the resulting synthetic diamond comprising carbon from remains of a human has a unique character to it, because it specifically relates to the individual who supplied at least a portion of the carbon for the synthetic diamond. This personal touch makes it much more valuable and meaningful to the owner of such a diamond. The diamond could also be marked with its own individual identification corresponding to the individual that the diamond originated from so that it could not be confused with a synthetic diamond not comprising carbon from that individual.

After the carbon has been collected, the remains can be more fully cremated in the usual fashion, yielding principally ash, which may be the conventional, light gray product of cremation containing little carbon. Since conventional cremation eliminates most of the native carbon, the resulting conventional cremation product can be substantially similar in consistency and volume to entirely conventionally cremated remains. Thus, by using the present process, both carbon remains suitable for conversion to a diamond and conventional remains suitable for inurnment can be produced.

Hence, while the invention has been described in connection with a preferred embodiment, it will be understood that it is not intended that the invention be limited to that embodiment. On the contrary, it is intended to cover all alternatives, modifications and equivalents as may be included within the spirit and scope of the invention as disclosed.

As to the manner of usage and operation of the instant invention, same should be apparent from the above disclosure, and accordingly no further discussion relevant to the manner of usage and operation of the instant invention shall be provided.

With respect to the above description then, it is to be realized that the optimum proportions for the elements of the invention, and variations in size, materials, shape, form, function and manner of operation, assembly and use, are deemed readily apparent and obvious to one skilled in the art, and all equivalent relationships described in the specification are intended to be encompassed by the present invention.

Therefore, the foregoing is considered illustrative of only the principles of the invention. Further, since numerous modifications and changes will readily occur to those skilled in the art, it is not desired to limit the invention to the exact method, construction and operation shown and described, and accordingly, all suitable modifications and equivalents may be resorted to, falling within the scope of the invention.

What claimed is:

1. A method of making synthetic diamond comprising:
   a. providing cremated human or animal remains;
   b. collecting residual carbon from said cremated human or animal remains by purifying said cremated human or animal remains in the presence of additional carbon from another source; and
   c. converting said residual carbon to diamond.

2. The method of claim 1, wherein said converting step is carried out under conditions effective to form a diamond gemstone.

3. The method of claim 2, further comprising faceting said diamond gemstone.

4. A method of making synthetic diamond comprising carbon derived from cremated remains, the method comprising:
   a. providing cremated human or animal remains;
   c. contacting the cremated remains with additional carbon;
   d. purifying the cremated remains while the cremated remains are in contact with said additional carbon, yielding purified carbon derived at least in part from said cremated remains; and
   e. converting said purified carbon derived at least in part from said cremated remains to diamond.

5. The method of claim 4, wherein said cremated human or animal remains are the result of cremation at conventional conditions.

6. The method of claim 5, wherein said conventional conditions include a temperature of 1400 degrees to 1800 degrees Fahrenheit (700 to 980 degrees C.).

7. The method of claim 5, wherein said conventional conditions include the presence of oxygen.

8. The method of claim 4, wherein said cremated remains as provided have been reduced to ashes.

9. The method of claim 4, wherein said cremated remains at the providing step consist essentially of bone ash and a small amount of carbon.

10. The method of claim 4, wherein the cremated remains at the providing step are light gray in color.

11. The method of claim 4, wherein the purifying step is a halogen purification technique.

12. The method of claim 11, wherein the halogen purification technique is carried out by heating the remains in a furnace in the presence of chlorine gas under conditions effective to remove essentially all materials but carbon from the cremated remains.

13. The method of claim 12, wherein the conditions of the halogen purification technique are also effective to graphitize said carbon.

14. The method of claim 4, wherein said converting step is carried out by crystal growth sublimation.

15. The method of claim 4, wherein said converting step is carried out under conditions effective to form a diamond gemstone.

16. The method of claim 15, further comprising faceting said diamond gemstone.

* * * * *